(12) United States Patent
Takeuchi et al.

(10) Patent No.: US 11,756,767 B2
(45) Date of Patent: Sep. 12, 2023

(54) PLASMA PROCESSING APPARATUS AND PLASMA PROCESSING METHOD

(71) Applicant: Tokyo Electron Limited, Tokyo (JP)

(72) Inventors: Takahiro Takeuchi, Miyagi (JP); Ken Kobayashi, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 105 days.

(21) Appl. No.: 17/475,909

(22) Filed: Sep. 15, 2021

(65) Prior Publication Data
US 2022/0084789 A1 Mar. 17, 2022

(30) Foreign Application Priority Data

Sep. 15, 2020 (JP) ................................ 2020-154843

(51) Int. Cl.
*H01J 37/32* (2006.01)

(52) U.S. Cl.
CPC .. *H01J 37/32146* (2013.01); *H01J 37/32183* (2013.01)

(58) Field of Classification Search
CPC ...................... H01J 37/32146; H01J 37/32183
See application file for complete search history.

(56) References Cited

U.S. PATENT DOCUMENTS

| 2013/0214828 A1* | 8/2013 | Valcore, Jr. ........ H01J 37/32174 327/141 |
| 2015/0072530 A1* | 3/2015 | Kim .................. H01L 21/31116 438/703 |
| 2021/0358757 A1* | 11/2021 | Shoeb .................... H01J 37/321 |

FOREIGN PATENT DOCUMENTS

JP         2019-067503 A        4/2019

OTHER PUBLICATIONS

Low Pressure Plasma Voltage Process for Transformer Coupling Plasma Dry Etching (Year: 2015).*

* cited by examiner

*Primary Examiner* — Henry Luong
(74) *Attorney, Agent, or Firm* — WEIHROUCH IP

(57) ABSTRACT

A plasma processing apparatus includes: a chamber; first and second matching circuits; a first RF generator generating a first RF pulsed signal including a plurality of first pulse cycles in which each cycle includes first, second, and third periods, and the first RF pulsed signal has first, second, and third power levels in first, second, and third periods, respectively; a second RF generator generating a second RF pulsed signal including a plurality of second pulse cycles in which each cycle includes fourth and fifth periods, and the second RF pulsed signal has fourth and fifth power levels in fourth and fifth periods, respectively; and a third RF generator generating a third RF pulsed signal including a plurality of third pulse cycles in which each cycle includes sixth and seventh periods, and the third RF pulsed signal has sixth and seventh power levels in sixth and seventh periods, respectively.

17 Claims, 9 Drawing Sheets

PLASMA PROCESSING APPARATUS AND PLASMA PROCESSING METHOD

CROSS-REFERENCE TO RELATED APPLICATIONS

This application is based on and claims priority from Japanese Patent Application No. 2020-154843, filed on Sep. 15, 2020, with the Japan Patent Office, the disclosures of which are incorporated herein in its entirety by reference.

TECHNICAL FIELD

The present disclosure relates to a plasma processing apparatus and a plasma processing method.

BACKGROUND

Japanese Patent Laid-Open Publication No. 2019-067503 proposes, for example, an inductively coupled plasma (ICP) apparatus that includes two radio-frequency power supplies to supply radio-frequency powers of two frequencies to an antenna above a chamber and a lower electrode (susceptor). Of the two radio-frequency power supplies, one radio-frequency power supply supplies a bias radio-frequency power having a frequency of, for example, 13 MHz to the lower electrode. The antenna is provided above the chamber, and the other radio-frequency power supply supplies a plasma excitation radio-frequency power of a frequency of, for example, 27 MHz to the central point of the line constituting an outer coil of the antenna, or the vicinity thereof.

SUMMARY

According to an aspect of the present disclosure, a plasma processing apparatus includes: a chamber; a first matching circuit coupled to the chamber; a second matching circuit coupled to the chamber; a first RF generator coupled to the first matching circuit, and configured to generate a first RF pulsed signal including a plurality of first pulse cycles, each first pulse cycle including a first period, a second period, and a third period, and the first RF pulsed signal having a first power level in the first period, a second power level in the second period, and a third power level in the third period; a second RF generator coupled to the second matching circuit, and configured to generate a second RF pulsed signal including a plurality of second pulse cycles, each second RF pulse cycle including a fourth period and a fifth period, the second RF pulsed signal having a frequency lower than a frequency of the first RF pulsed signal and having a fourth power level in the fourth period and a fifth power level in the fifth period, and the fourth period being 30 µs or less and set not to overlap with the first period; and a third RF generator coupled to the second matching circuit, and configured to generate a third RF pulsed signal including a plurality of third pulse cycles, each third pulse cycle including a sixth period and a seventh period, the third RF pulsed signal having a frequency lower than the frequency of the second RF pulsed signal and having a sixth power level in the sixth period and a seventh power level in the seventh period, and the sixth period being set not to overlap with the first period and the fourth period.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
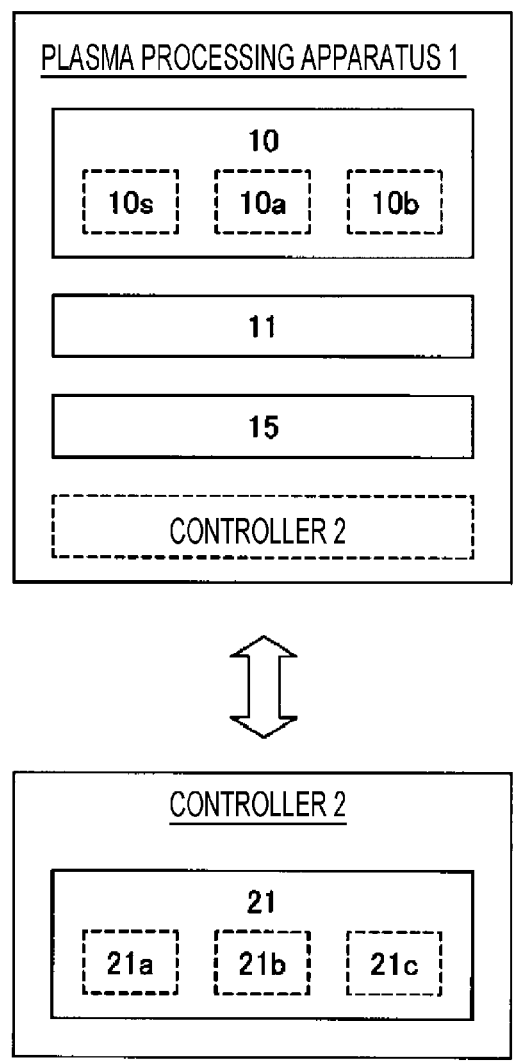
FIG. 1 is a schematic cross-sectional view illustrating an example of a plasma processing system according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the drawings. In the respective drawings, the same components will be denoted by the same reference numerals, and overlapping descriptions thereof may be appropriately omitted.

[Plasma Processing System]

Figure 2:
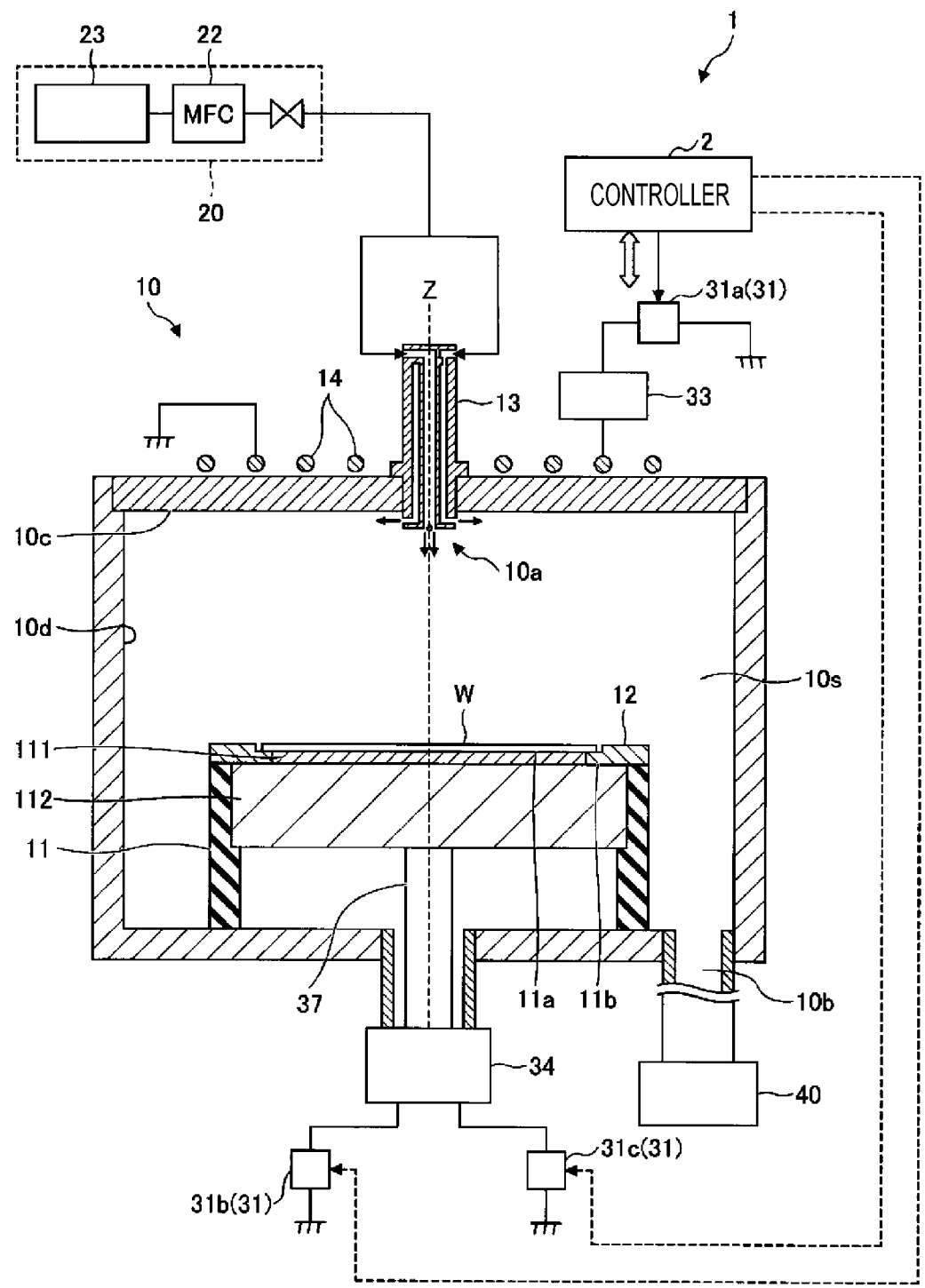
FIG. 2 is a view illustrating an example of a plasma processing apparatus according to an embodiment.

First, a plasma processing system according to an embodiment will be described with reference to FIGS. 1 and 2. FIG. 1 is a schematic cross-sectional view illustrating an example of the plasma processing system according to the embodiment. FIG. 2 is a view illustrating an example of a plasma processing apparatus 1 according to an embodiment.

In an embodiment, the plasma processing system includes the plasma processing apparatus 1 and a controller 2. The plasma processing apparatus 1 is configured to supply three radio-frequency power pulses (three RF pulsed signals) into a chamber 10, thereby generating plasma from a processing gas in the chamber 10. The plasma processing apparatus 1 may be configured to supply two radio-frequency power pulses (two RF pulsed signals) into the chamber 10, thereby generating plasma from the processing gas in the chamber 10. Then, the plasma processing apparatus 1 exposes the generated plasma to a substrate so as to process the substrate.

The plasma processing apparatus 1 includes a chamber 10, a substrate support 11, and a plasma generator. The chamber 10 defines a plasma processing space 10s. Further, the chamber 10 includes a gas inlet 10a for supplying at least one processing gas into the plasma processing space 10s, and a gas outlet 10b for discharging the gas from the plasma processing space. The gas inlet 10a is connected to at least one gas supply 20.

The gas outlet 10b is, for example, an exhaust port provided at the bottom of the chamber 10, and is connected to an exhaust system 40. The exhaust system 40 may include a pressure valve and a vacuum pump. The vacuum pump may include a turbo molecular pump, a roughing pump, or a combination thereof.

The substrate support 11 is disposed in the plasma processing space 10s to support a substrate W. The plasma generator is configured to generate plasma from at least one processing gas supplied into the plasma processing space 10s. The plasma formed in the plasma processing space 10s may be capacitively coupled plasma (CCP) or inductively coupled plasma (ICP).

The controller 2 processes computer-executable instructions for instructing the plasma processing apparatus 1 to execute various processes to be described herein below. The controller 2 may be configured to control the respective components of the plasma processing apparatus 1 to execute the various processes to be described herein below. In an embodiment, as illustrated in FIG. 1, a portion of the controller 2 or the entire controller 2 may be included in the plasma processing apparatus 1. The controller 2 may include, for example, a computer 21. The computer 21 may include, for example, a processing unit (central processing unit (CPU)) 21a, a storage unit 21b, and a communication interface 21c. The processing unit 21a may be configured to perform various control operations based on programs stored in the storage unit 21b. The storage unit 21b may include a random access memory (RAM), a read only memory (ROM), a hard disk drive (HDD), a solid state drive (SSD), or a combination thereof. The communication interface 21c may communicate with the plasma processing apparatus 1 through a communication line such as a local area network (LAN).

Hereinafter, an example of a configuration of the plasma processing apparatus 1 will be further described, using the inductively coupled plasma processing apparatus of FIG. 2 as an example. The plasma processing apparatus 1 includes the chamber 10. The chamber 10 includes a dielectric window 10c and a side wall 10d. The dielectric window 10c and the side wall 10d define the plasma processing space 10s in the chamber 10. Further, the plasma processing apparatus 1 includes the substrate support 11, a gas introduction unit 13, the gas supply 20, a power supply, and the antenna 14.

The substrate support 11 is disposed in the plasma processing space 10s inside the chamber 10. The antenna 14 is disposed on or above the chamber 10 (the dielectric window 10c).

The substrate support 11 includes a main body and an annular member (an edge ring) 12. The main body has a central region (a substrate support surface) 11a for supporting the substrate (wafer) W, and an annular region (an edge ring support surface) 11b for supporting the annular member 12. The annular region 11b of the main body surrounds the central region 11a of the main body. The substrate W is placed on the central region 11a of the main body, and the annular member 12 is disposed on the annular region 11b of the main body to surround the substrate W on the central region 11a of the main body. In the embodiment, the main body includes an electrostatic chuck 111 and a conductive member 112. The electrostatic chuck 111 is disposed on the conductive member 112. The conductive member 112 functions as an RF electrode, and the upper surface of the electrostatic chuck 111 functions as a substrate supporting surface (the central region 11a). Although not illustrated, in an embodiment, the substrate support 11 may include a temperature control module configured to adjust at least one of the electrostatic chuck 111 and the substrate W to a target temperature. The temperature control module may include a heater, a flow path, or a combination thereof. A temperature control fluid such as a refrigerant or a heat transfer gas flows through the flow path. The chamber 10, the substrate support 11, and the annular member 12 are arranged to coincide with each other around the central axis Z.

The gas introduction unit 13 is configured to supply at least one processing gas from the gas supply 20 into the plasma processing space 10s. In the embodiment, the gas introduction unit 13 is disposed above the substrate support 11, and attached to the central opening formed in the dielectric window 10c.

The gas supply 20 may include at least one gas source 23 and at least one flow rate controller 22. In the embodiment, the gas supply 20 is configured to supply one or more processing gases from the respective corresponding gas sources 23 to the gas introduction unit 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of one or more processing gases.

The power supply includes an RF power supply 31 coupled to the chamber 10. The RF power supply 31 is configured to supply three RF signals (RF powers) to the conductive member 112 of the substrate support 11 or the antenna 14. As a result, plasma is formed from at least one processing gas supplied into the plasma processing space 10s. The plasma generator may include the gas supply 20 that supplies at least one processing gas into the plasma processing space 10s, and the RF power supply 31, and may be configured to generate plasma from the processing gas.

The antenna 14 includes one or more coils. In an embodiment, the antenna 14 may include an outer coil and an inner coil that are coaxially arranged. In this case, the RF power supply 31 may be connected to both the outer coil and the inner coil, or may be connected to either the outer coil or the inner coil. In the former case, the same RF generator may be connected to both the outer coil and the inner coil, or separate RF generators may be connected to the outer coil and the inner coil, respectively.

In the embodiment, the RF power supply 31 includes a source RF generator 31a, a first bias RF generator 31b, and a second bias RF generator 31c. The source RF generator 31a is connected to the antenna 14, and the first bias RF generator 31b and the second bias RF generator 31c are coupled to the conductive member 112. The source RF generator 31a is coupled to the antenna 14 via a first matching circuit 33, and configured to generate a first RF pulsed signal (hereinafter, also referred to as an HF power) for generating plasma. In an embodiment, the first RF pulsed signal has a frequency in a range of 20 MHz to 60 MHz. The generated first RF pulsed signal is supplied to the antenna 14. The first RF pulsed signal includes a plurality of first pulse cycles, and each of the plurality of first pulse cycles first, second, and third periods. The first RF pulsed signal has a first power level in the first period, a second power level in the second period, and a third power level in the third period. The first RF pulsed signal has at least three power levels, each of which is zero (0) or more. Accordingly, the first RF pulsed signal may have High/Middle/Low power levels, which are larger than zero (0). Further, the first RF pulsed signal may have High/Low power levels and a zero (0) power level (OFF). The source RF generator 31a is an example of a first RF generator coupled to the first matching circuit 33 and configured to generate the first RF pulsed signal that includes the plurality of first pulse cycles.

Further, the first bias RF generator is connected to the conductive member 112 of the substrate support 11 via a second matching circuit 34 and a power feeding line 37, and configured to generate a second RF pulsed signal (hereinafter, also referred to as an LF1 power). The generated second RF pulsed signal is supplied to the conductive member 112 of the substrate support 11. In an embodiment, the second RF pulsed signal has a frequency lower than the frequency of the first RF pulsed signal. In an embodiment, the second RF pulsed signal has a frequency in a range of 1 MHz to 15 MHz. The second RF pulsed signal has a fourth power level in a fourth period, and a fifth power level in a fifth period. The fourth period is 30 μs or less. Accordingly, the second RF pulsed signal may have High/Low power levels, which are zero (0) or more. Further, the second RF pulsed signal may have a power level more than zero (0) and a zero (0) power level, that is, ON/OFF signals. The first bias RF generator is an example of a second RF generator coupled to the second matching circuit 34 and configured to generate the second RF pulsed signal that include a plurality of second pulse cycles.

Further, the second bias RF generator is connected to the conductive member 112 of the substrate support 11 via the second matching circuit 34 and the power feeding line 37, and configured to generate a third RF pulsed signal (hereinafter, also referred to as an LF2 power). The generated third RF pulsed signal is supplied to the conductive member 112 of the substrate support 11. In an embodiment, the third RF pulsed signal has a frequency lower than the frequency of the second RF pulsed signal. In an embodiment, the third RF pulsed signal has a frequency in a range of 100 kHz to 4 MHz. The third RF pulsed signal has a sixth power level in a sixth period, and a seventh power level in a seventh period. The third RF pulsed signal has at least two power levels, each of which is zero (0) or more. Accordingly, the third RF pulsed signal may have High/Low power levels, which are zero (0) or more. Further, the third RF pulsed signal may have a power level more than zero (0) and a zero (0) power level, that is, ON/OFF signals. The second bias RF generator is an example of a third RF generator coupled to the second matching circuit 34, and configured to generate the third RF pulsed signal that includes a plurality of third pulse cycles.

In this way, the first RF pulsed signal, the second RF pulsed signal, and the third RF pulsed signal are pulsed. The second RF pulsed signal and the third RF pulsed signal are pulsed between the ON state and the OFF state or between the two or more different ON states (High/Low). The first RF pulsed signal is pulsed among the two or more different ON states (High/Low) and the OFF state, or among the three or more different ON states (High/Middle/Low). The first RF pulsed signal may be pulsed between the ON state and the OFF state, or between two different ON states (High/Low).

The first matching circuit 33 is connected to the source RF generator 31a and the antenna 14, and connected to the chamber 10 via the antenna 14. The first matching circuit 33 enables the first RF pulsed signal to be supplied from the source RF generator 31a to the antenna 14 via the first matching circuit 33. Further, the first matching circuit 33 may be connected to a component other than the antenna 14 in another plasma processing apparatus. For example, in a capacitively coupled plasma processing apparatus that includes two opposing electrodes, the first matching circuit 33 may be connected to one of the two electrodes.

The second matching circuit 34 is connected to the first bias RF generator 31b, the second bias RF generator 31c, and the substrate support 11 (the conductive member 112). The second matching circuit 34 enables the second RF pulsed signal to be supplied from the first bias RF generator 31b to the substrate support 11 via the second matching circuit 34. Further, the second matching circuit 34 enables the third RF pulsed signal to be supplied from the second bias RF generator 31c to the substrate support 11 via the second matching circuit 34.

The controller 2 outputs a control signal for instructing to supply each pulsed signal to each of the source RF generator 31a, the first bias RF generator 31b, and the second bias RF generator 31c. Accordingly, the first RF pulsed signal, the second RF pulsed signal, and the third RF pulsed signal each of which includes a plurality of pulse cycles are supplied at predetermined timings, and plasma is generated from the processing gas in the chamber 10. Then, the generated plasma is exposed to the substrate, so as to perform a substrate processing. As a result, the efficiency of the process may be improved, and thus, the substrate processing may be implemented with a high accuracy. The timings when the controller 2 controls the ON/OFF states of the first RF pulsed signal, the second RF pulsed signal, and the third RF pulsed signal, or the power levels that are zero (0) or more will be described later.

[Example of Internal Configuration of Second Matching Circuit]

Figure 3:
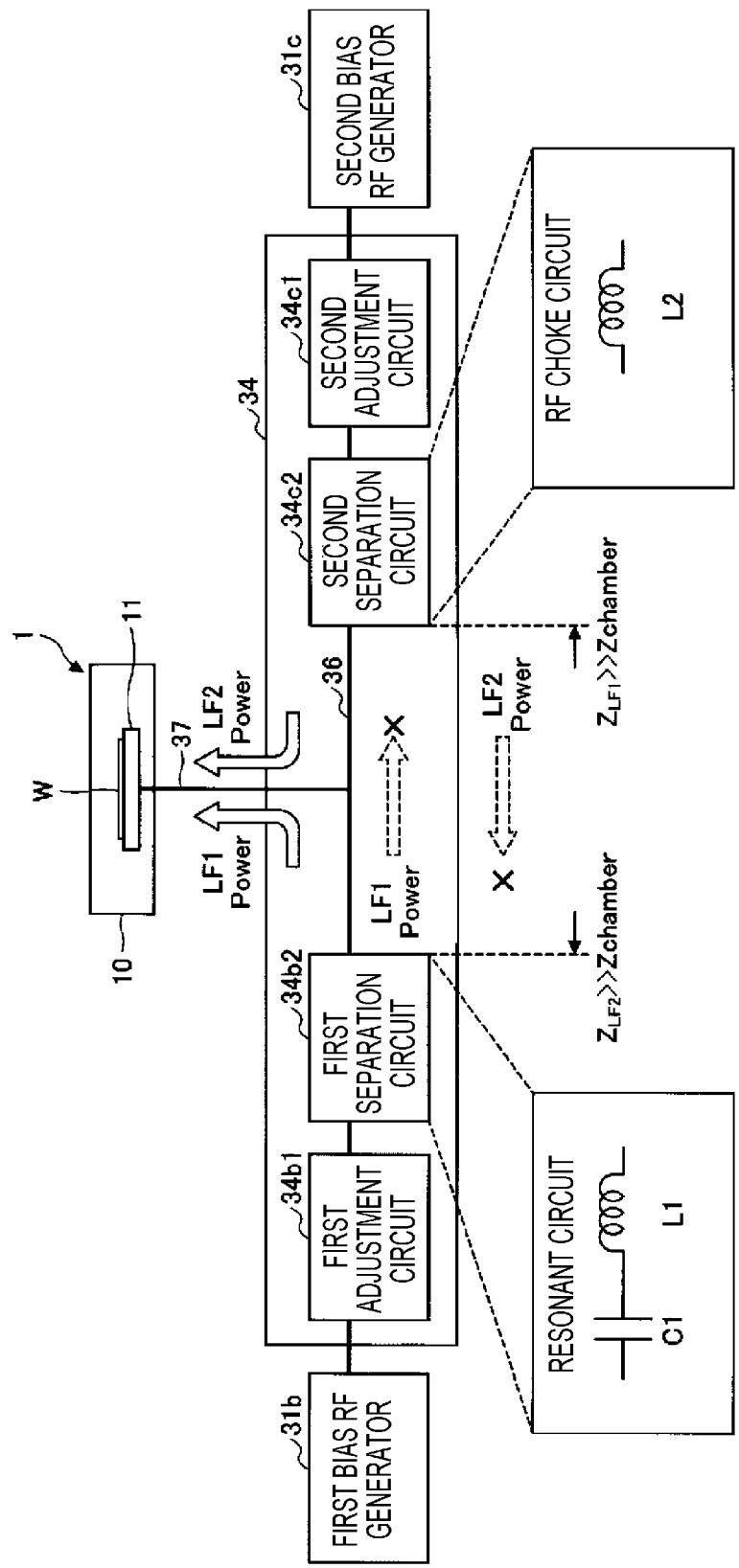
FIG. 3 is a view illustrating an example of a matching circuit of two bias RF pulsed signals according to an embodiment.

Next, an example of the configuration of the second matching circuit 34 will be described with reference to FIG. 3. FIG. 3 is a view illustrating an example of the internal configuration of the second matching circuit 34 according to an embodiment.

The first bias RF generator 31b and the second bias RF generator 31c are connected to the substrate support 11 (the conductive member 112) via the second matching circuit 34 and the power feeding line 37. The second RF pulsed signal supplied from the first bias RF generator 31b will also be referred to as the LF1 power in the following descriptions. Further, the third RF pulsed signal supplied from the second bias RF generator 31c will also be referred to as the LF2 power in the following descriptions.

When the second RF pulsed signal (the LF1 power) supplied from the first bias RF generator 31b is coupled to the opposite side (the second bias RF generator 31c) via the power feeding line 36 in the second matching circuit 34, the supply efficiency of the LF1 power supplied to the chamber 10 is deteriorated. Similarly, when the third RF pulsed signal (the LF2 power) supplied from the second bias RF generator 31c is coupled to the opposite side (the first bias RF generator 31b) via the power feeding line 36, the supply efficiency of the LF2 power supplied to the chamber 10 is deteriorated. Then, since the supply of the bias power to the chamber 10 is reduced, it becomes difficult to control the ion energy or the like, and the process performance is deteriorated.

Thus, the second matching circuit 34 according to the present embodiment includes a first adjustment circuit 34b1, a first separation circuit 34b2, a second adjustment circuit 34c1, and a second separation circuit 34c2. The first adjustment circuit 34b1 and the first separation circuit 34b2 are connected between the first bias RF generator 31b and the power feeding line 37. The second adjustment circuit 34c1 and the second separation circuit 34c2 are connected between the second bias RF generator 31c and the power feeding line 37. With this configuration, the second RF pulsed signal (the LF1 power) generated in the first bias RF generator 31b is supplied to the substrate support 11 (the conductive member 112), while being suppressed from being coupled to the second bias RF generator 31c. Further, the third RF pulsed signal (the LF2 power) generated in the second bias RF generator 31c is supplied to the substrate support 11 (the conductive member 112), while being suppressed from being coupled to the first bias RF generator 31b.

The first adjustment circuit 34b1 includes a variable element, and is configured to match the impedance of the load side (the substrate support 11) of the first bias RF generator 31b with the output impedance of the first bias RF generator 31b. In an embodiment, the variable element of the first adjustment circuit 34b1 is a variable capacitor.

The second separation circuit 34c2 is connected between the second bias RF generator 31c and the substrate support 11, and suppresses the coupling of the second RF pulsed signal which is the LF1 power from the first bias RF generator 31b.

The second adjustment circuit 34c1 includes a variable element, and is configured to match the impedance of the load side (the substrate support 11) of the second bias RF generator 31c with the output impedance of the second bias RF generator 31c. In an embodiment, the variable element of the second adjustment circuit 34c1 is a variable inductor.

The first separation circuit 34b2 is connected between the first bias RF generator 31b and the substrate support 11, and suppresses the coupling of the third RF pulsed signal which is the LF2 power from the second bias RF generator 31c.

The second separation circuit 34c2 is an RF choke circuit that includes an inductor L2. The first separation circuit 34b2 is a resonant circuit that includes a capacitor C1 and an inductor L1. The first separation circuit 34b2 is configured by the capacitor C1 and the inductor L1. The second separation circuit 34c2 is configured by the inductor L2.

The first separation circuit 34b2 sets circuit constants of C1 and L1 such that the impedance viewed from the second RF pulsed signal seems to be zero (0) or close to zero (0), and the impedance viewed from the third RF pulsed signal seems to be high and seems to be a wall close to the first bias RF generator 31b. Then, when the impedance of the first separation circuit 34b2 viewed from the third RF pulsed signal is $Z_{LF2}$, and the load impedance of the plasma is $Z_{chamber}$, $Z_{LF2} \gg Z_{chamber}$ is established.

Further, the second separation circuit 34c2 sets a circuit constant of L2 such that the impedance viewed from the third RF pulsed signal seems to be zero (0) or close to zero (0), and the impedance viewed from the second RF pulsed signal seems to be high and seems to be a wall close to the second bias RF generator 31c. Then, when the impedance of the second separation circuit 34c2 viewed from the second RF pulsed signal is $Z_{LF1}$, $Z_{LF1} \gg Z_{chamber}$ is established.

By setting the circuit constants of the first separation circuit 34b2 as described above, the impedance $Z_{LF2}$ of the first separation circuit 34b2 becomes much larger than the load impedance $Z_{chamber}$ of the plasma. Accordingly, the first separation circuit 34b2 suppresses the coupling of the third RF pulsed signal from the second bias RF generator 31c ("LF2 Power→X" in FIG. 3). As a result, the LF2 power is supplied into the chamber 10 through the power feeding line 37, so that the deterioration of the supply efficiency of the LF2 power may be suppressed.

Similarly, by setting the circuit constant of the second separation circuit 34c2 as described above, the impedance $Z_{LF1}$ of the second separation circuit 34c2 becomes much larger than the load impedance $Z_{chamber}$ of the plasma. Accordingly, the second separation circuit 34c2 suppresses the coupling of the second RF pulsed signal from the first bias RF generator 31b ("LF1 Power→X" in FIG. 3). As a result, the LF1 power is supplied into the chamber 10 through the power feeding line 37, so that the deterioration of the supply efficiency of the LF1 power may be suppressed.

With this configuration, the pulsed signals of the two bias powers (the LF1 power and the LF2 power) having different frequencies may be efficiently supplied to the substrate support 11.

[Pulsed Signals]

For example, in a process of etching a deep hole having a high aspect ratio, the incidence angle of ions may be made vertical, or the mask selectivity may be increased, by using the pulsed signals of the HF power, the LF1 power, and the LF2 power.

Figure 4:
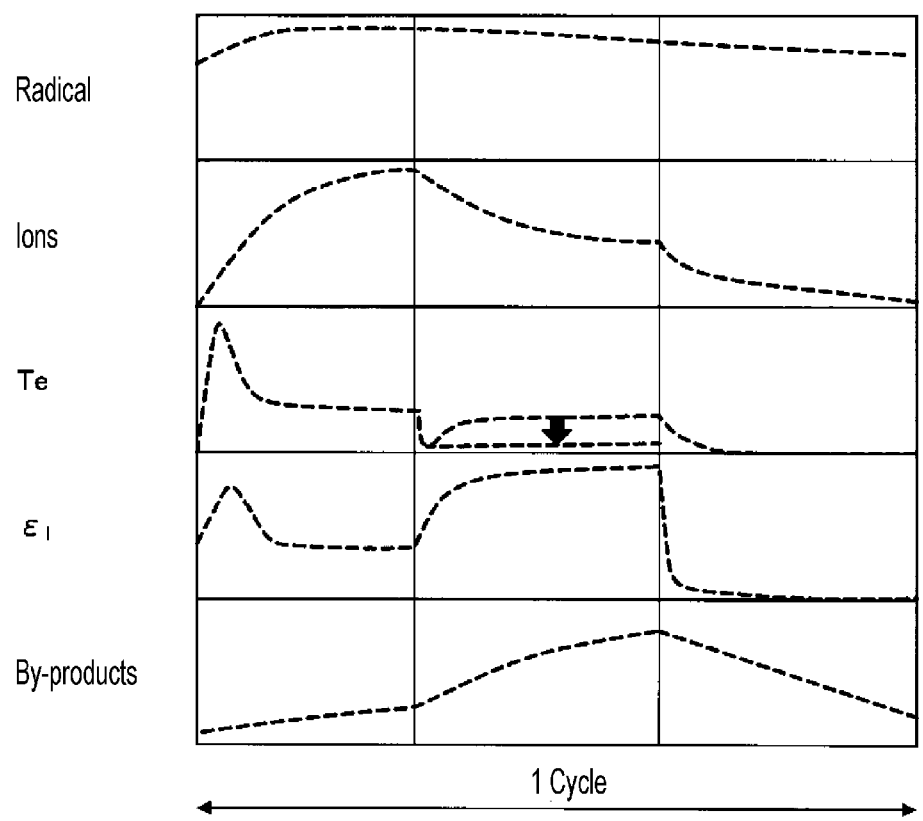
FIG. 4 is a view illustrating examples of radicals, ions, an electron temperature, an ion energy, and by-products.

FIG. 4 is a view illustrating examples of radicals, ions, an electron temperature, an ion energy, and by-products. The horizontal axis of FIG. 4 represents the time that elapses after the supply of the RF power is stopped (OFF) (one cycle). The vertical axis of FIG. 4 represents the states of the radicals (Radical), the ions (Ions), the electron temperature (Te), the ion energy ($\varepsilon_i$), and the by-products (By-products) in each time from the OFF time.

According to the states, while the variation of the radicals (Radical) after the OFF state of the RF power is slow, the variations of the ions (Ions) and the plasma temperature (Te) after the OFF state of the RF power are faster than the variation of the radicals. The pulsed signals of the HF power and the LF power (e.g., the LF1 power and the LF2 power) are controlled in consideration of, for example, the attenuation of radicals or ions in plasma or the variation of energy. As for an example of the pulsed signal of the LF power supplied after the HF power is turned OFF, a control may be considered which turns OFF the LF power during the initial time when the plasma temperature (Te) is high, and turns ON the LF power after the plasma temperature (Te) decreases. As a result, the ions may be effectively drawn into the substrate, using the LF power in the time when the ions still remain, but the plasma temperature (Te) is low.

As for another example of the pulsed signal of the LF power supplied after the HF power is turned OFF, the LF2 power may be controlled, by using $\varepsilon_i$ that indicates the ion energy as a plasma parameter, during the time when the plasma electron temperature (Te) does not substantially vary. As a result, by controlling the ion energy ($\varepsilon_i$), the incidence angle of ions may be controlled to be more vertical.

In this way, the timings for turning ON/OFF the HF power and the LF power are finely controlled according to the movements of the plasma parameters such as the radicals, the ions, the plasma electron temperature, the ion energy, and the by-products. As a result, the performance of the process may be improved. Hereinafter, the timings for supplying the pulsed signals of the radio-frequency powers will be described with reference to FIGS. 5 to 8. The timings for supplying the pulsed signals of the radio-frequency powers are controlled by the controller 2.

(Pulsed Signals of Two Frequencies)

Figure 5:
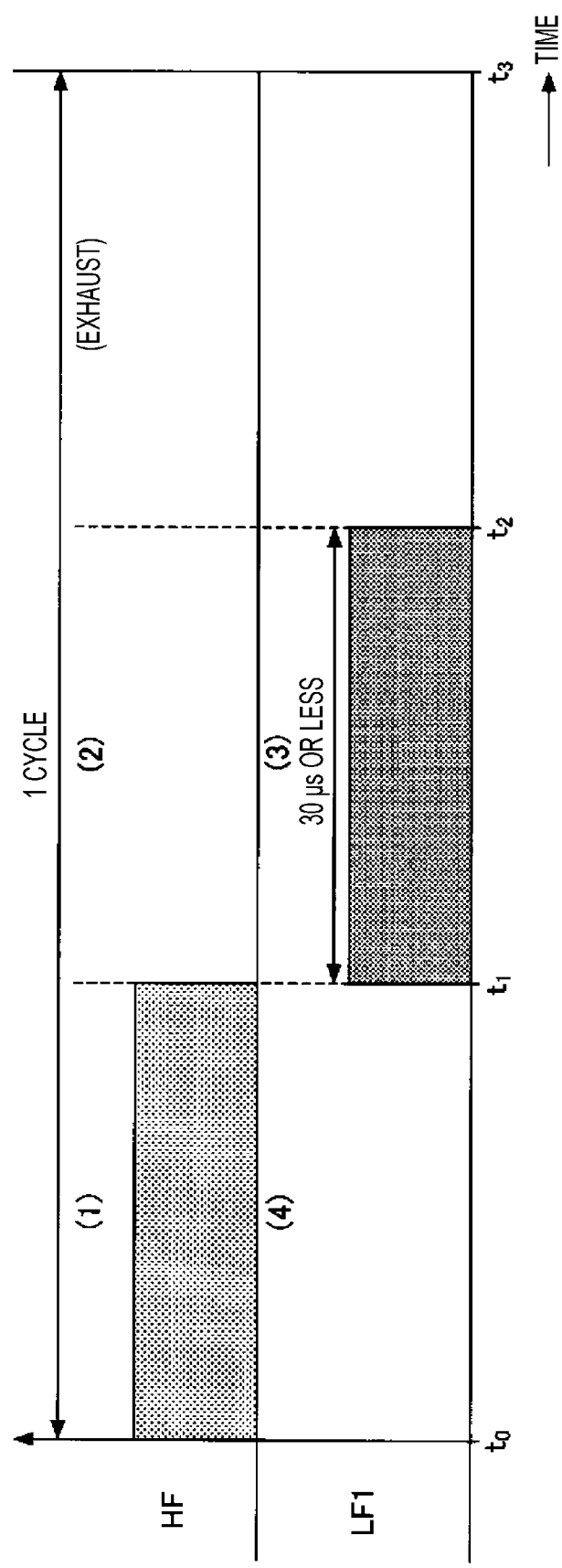
FIG. 5 is a view illustrating pulse patterns of radio-frequency power pulses of two frequencies according to an embodiment.

FIG. 5 is a view illustrating pulse patterns of radio-frequency power pulses of two frequencies according to an embodiment. Of the radio-frequency power pulses of two frequencies illustrated in FIG. 5, the HF power (Source Power) includes a plurality of first pulse cycles. The pulsed signal of the LF1 power (Bias Power) includes a plurality of second pulse cycles. Hereinafter, the timings for supplying the respective pulsed signals will be described. In FIG. 5, the horizontal axis represents the time of one cycle, and the vertical axis represents the ON/OFF states of the HF power and the LF1 power. Each of the plurality of first pulse cycles of the HF power includes periods (1) and (2), and each of the plurality of second pulse cycles of the LF1 power includes periods (3) and (4). In the example of FIG. 5, the first RF pulsed signal of the HF power is repeated per cycle that includes the periods (1) and (2) of each of the plurality of first pulse cycles, and an exhaust period. The second RF pulsed signal of the LF1 power is repeated per cycle that includes the periods (4) and (3) of each of the plurality of second pulse cycles, and an exhaust period.

The source RF generator 31a is configured to generate the first RF pulsed signal (the HF power). In the present embodiment, the first RF pulsed signal has the two power levels (ON/OFF). The first bias RF generator 31b is configured to generate the second RF pulsed signal (the LF1 power). In the present embodiment, the second RF pulsed signal has the two power levels (ON/OFF).

The ON state of the HF power and the ON state of the LF1 power do not overlap with each other in time. For example, the first RF pulsed signal has the first power level in the period (1) and the second power level in the period (2), in which the first power level is the ON state, and the second power level is the OFF state. That is, the second power level is the zero (0) power level. The second RF pulsed signal has the third power level in the period (3) and the fourth power level in the period (4), in which the third power level is the ON state, and the fourth power level is the OFF state. That is, the fourth power level is the zero (0) power level.

The first RF pulsed signal may have a frequency of 27 MHz. The frequency of the second RF pulsed signal is lower than the frequency of the first RF pulsed signal. For example, the second RF pulsed signal has a frequency of 13 MHz. The first power level may be High, and the second power level may be Low. Further, the third power level may be High, and the fourth power level may be Low.

In FIG. 5, the HF power is maintained in the ON state in the period (1), and the LF1 power is maintained in the OFF state in the period (4) that coincides with the period (1) in time. Accordingly, in the time from a timing $t_0$ to a timing $t_1$, plasma containing radicals and ions is generated by the supply of the HF power.

At the timing $t_1$, the HF power shifts to the OFF state, the LF1 power shifts to the ON state, the HF power is maintained in the OFF state in the period (2), and the LF1 power is maintained in the ON state in the period (3) that coincides with the period (2) in time. Since the HF power is in the OFF state in the period (2), the radicals, the ions, and the plasma temperature are attenuated with their respective time constants, as in the example illustrated in FIG. 4. The flux of ions (the amount of ions) that reach the bottom of a recess being etched is controlled by the supply of the LF1 power in the period (3), so that the etching is promoted. At a timing $t_2$, the HF power is maintained in the OFF state, and the LF1 power shifts to the OFF state. Since the HF power and the LF1 power are in the OFF state in the exhaust period after the periods (2) and (3), the by-products are exhausted. Each exhaust period is preset to a time during which the by-products do not adhere to the substrate W.

One cycle ends at a timing $t_3$ after the exhaust period, and shifts to the period (1) of the next cycle. Then, the HF power shifts to the ON state again at the time $t_0$ of the next cycle, and the LF1 power is maintained in the OFF state in the period (4). That is, the first pulse cycle of the HF power is repeated per cycle that includes the periods (1) and (2), and the exhaust period. Further, the second pulse cycle of the LF1 power is repeated per cycle that includes the periods (4) and (3), and the exhaust period. One cycle is 1 kHz to 20 kHz. The plurality of pulse cycles have the same time period, and each pulse cycle has a time period of 50 μs to 1,000 μs. That is, one cycle of the pulse cycle is 50 μs to 1,000 μs.

The period (3) does not overlap with the period (1) in time. That is, the first bias RF generator 31b offsets the timing for changing the power level of the second RF pulsed signal with respect to the timing for changing the power level of the first RF pulsed signal, such that the ON state of the HF power and the ON state of the LF1 power do not overlap with each other in time.

The period (3) is set to 30 μs or less. The periods (1), (2), and (4) are set to arbitrary time, and may be longer than 30 μs. That is, in the present example, ON/OFF of the LF1 power is repeated in the manner that the LF1 power is maintained in the ON state for the time of 30 μs or less in the period (3), and maintained in the OFF state for arbitrary time in the period (4) and the exhaust period. In this way, when the supply time of the LF1 power in one cycle is set to 30 μs or less, the incidence angle of ions is controlled to be vertical, so that an etching with a high anisotropy may be implemented.

The power level of the HF power in the period (1) is an example of the first power level, and the power level of the HF power in the period (2) is an example of the second power level. The power level of the LF1 power in the period (3) is an example of the third power level, and the power level of the LF1 power in the period (4) is an example of the fourth power level.

(Pulsed Signals of Three Frequencies)

Figure 6:
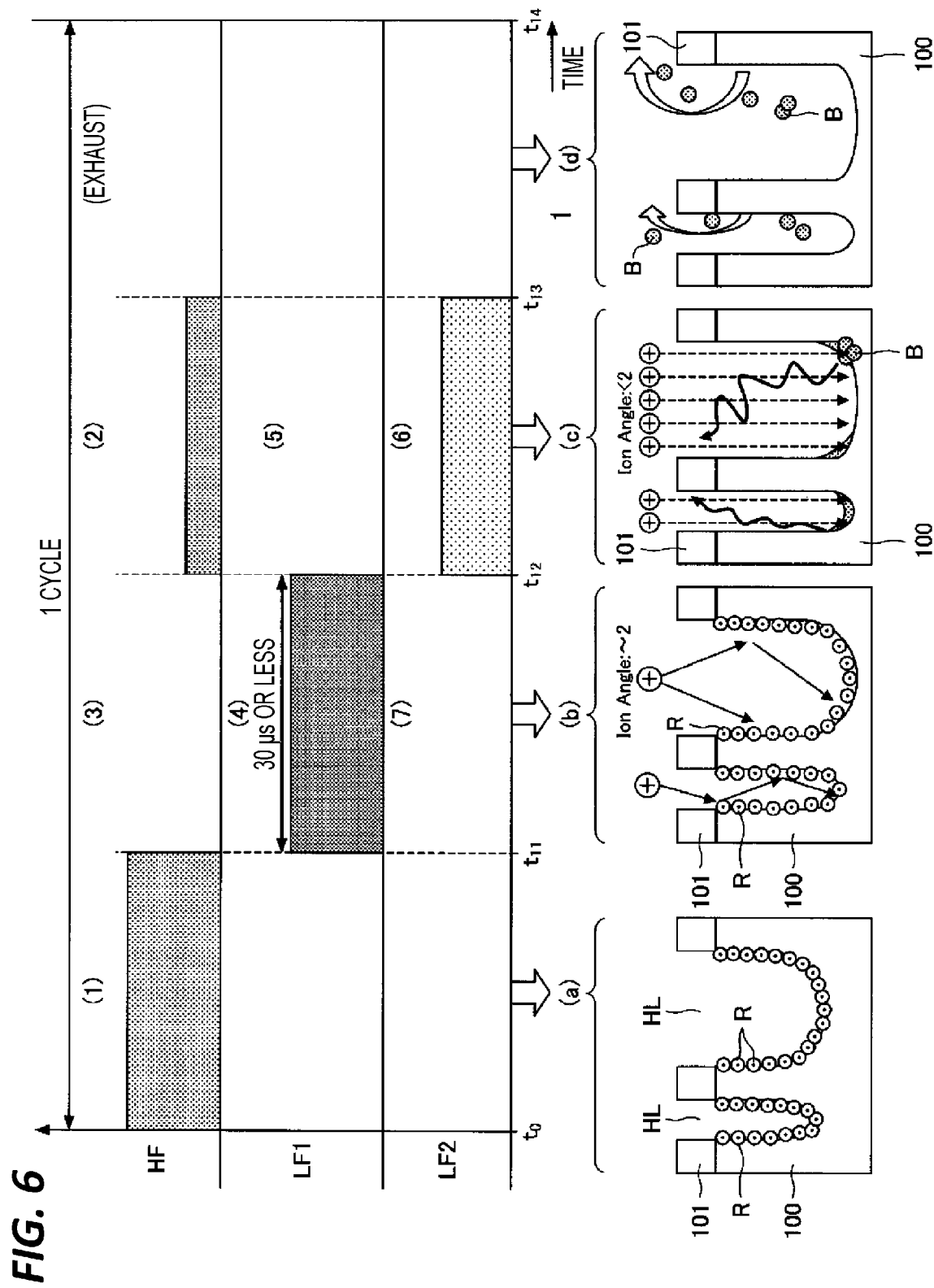
FIG. 6 is a view illustrating pulse patterns of radio-frequency power pulses of three frequencies according to an embodiment.
Figure 7:
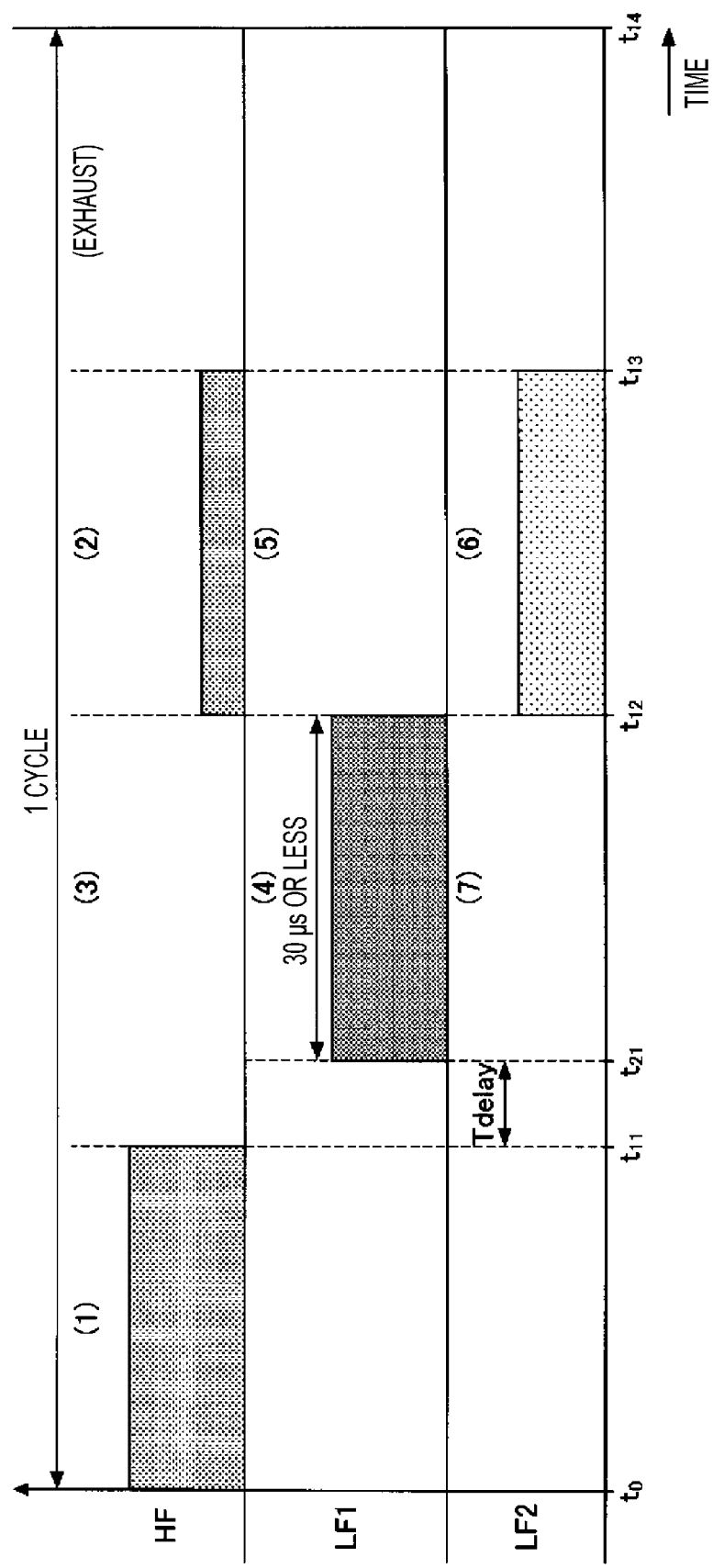
FIG. 7 is a view illustrating pulse patterns of radio-frequency power pulses of three frequencies according to an embodiment.
Figure 8:
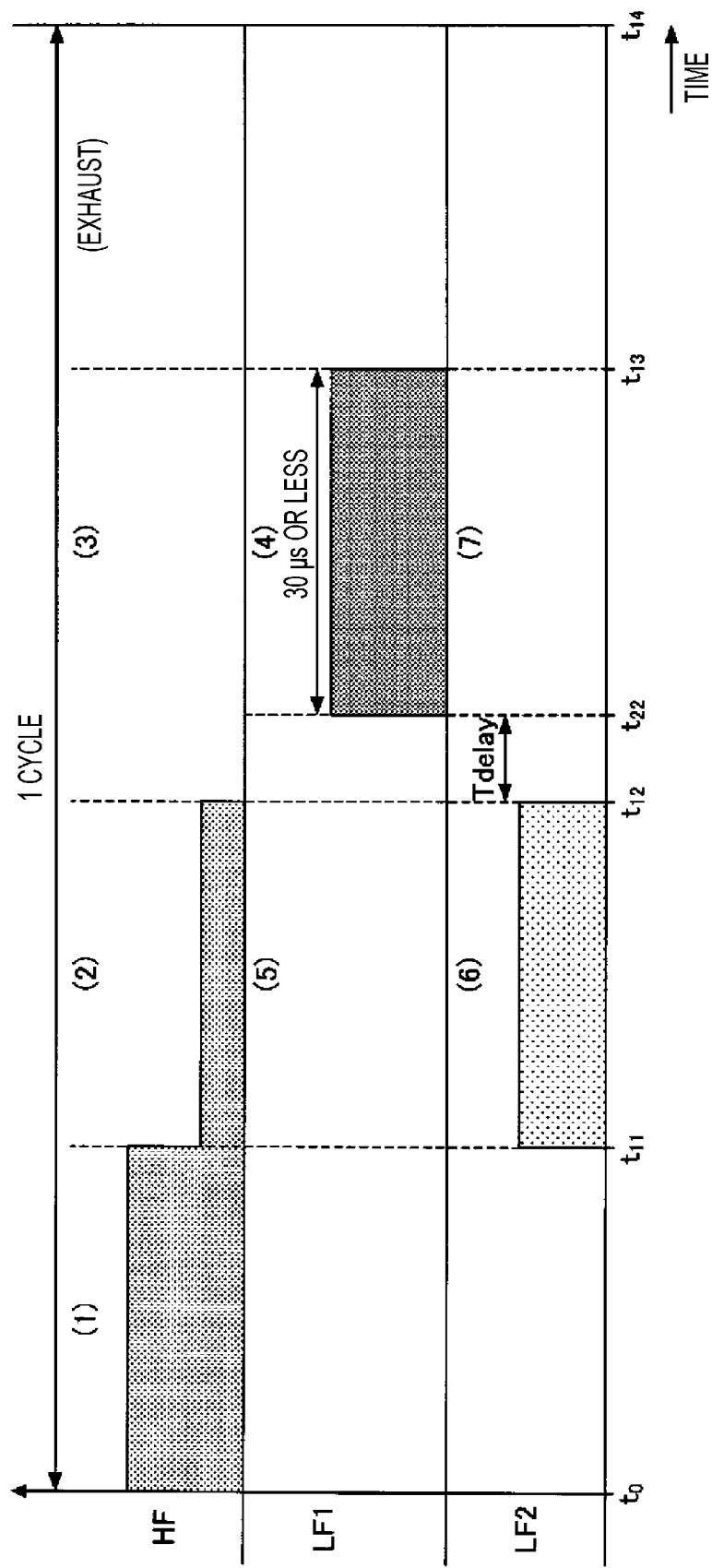
FIG. 8 is a view illustrating pulse patterns of radio-frequency power pulses of three frequencies according to an embodiment.

FIGS. 6 to 8 are views illustrating pulse patterns of radio-frequency power pulses of three frequencies according to an embodiment. The pulsed signal of each of the HF power (Source Power), the LF1 power (Bias1 Power), and the LF2 power (Bias2 Power), which are the radio-frequency powers of the three frequencies illustrated in FIGS. 6 to 8, includes a plurality of pulse cycles. Hereinafter, the timings for supplying each pulsed signal will be described. In FIGS. 6 to 8, the horizontal axis represents the time of one cycle, and the vertical axis represents the ON/OFF states of the HF power, the LF1 power, and the LF2 power. The control of the pulsed signal of each of the HF power, the LF1 power, and the LF2 power is repeated per cycle that includes the first pulse cycle of the HF power, the second pulse cycle of the LF1 power, or the third pulse cycle of the LF2 power (All of the pulse cycles each include the exhaust period).

In the control of the radio-frequency power pulses of the three frequencies, the ON state of the LF1 power and the ON state of the LF2 power do not overlap with each other in time, in the manner that the LF2 power is turned OFF while the LF1 power is turned ON, and the LF2 power is turned ON while the LF1 power is turned OFF. Further, the High power level of the HF power and the ON state of the LF1 power do not overlap with each other in time, in the manner that the LF1 power is turned OFF while the HF power is set to the High power level, and the HF power is turned OFF or set to the Low power level while the LF1 power is turned ON. Similarly, the High power level of the HF power and the ON state of the LF2 power do not overlap with each other in time, in the manner that the LF2 power is turned OFF while the HF power is set to the High power level, and the HF power is turned OFF or set to the Low power level while the LF2 power is turned ON.

The source RF generator 31a is configured to generate the first RF pulsed signal (the HF power), and in the present embodiment, the first RF pulsed signal has the three power levels (High/Low/OFF). The power levels may be arbitrarily set and changed according to a target process. For example, the first RF pulsed signal has a frequency of 27 MHz.

The first bias RF generator 31b is configured to generate the second RF pulsed signal (the LF1 power), and in the present embodiment, the second RF pulsed signal has the two power levels (ON/OFF). That is, the second RF pulsed signal has two or more power levels that include the zero (0) power level. The frequency of the second RF pulsed signal is lower than the frequency of the first RF pulsed signal. For example, the second RF pulsed signal has a frequency of 13 MHz.

The second bias RF generator 31c is configured to generate the third RF pulsed signal (the LF2 power), and in the present embodiment, the third RF pulsed signal has the two power levels (ON/OFF). That is, the third RF pulsed signal has two or more power levels that includes the zero (0) power level. The frequency of the third RF pulsed signal is lower than the frequency of the second RF pulsed signal. For example, the third RF pulsed signal has a frequency of 1.2 MHz.

FIGS. 6 to 8 illustrate a state where the HF power is the first RF pulsed signal, the LF1 power is the second RF pulsed signal, and the LF2 power is the third RF pulsed signal.

In the period (1) of FIG. 6, the HF power has the High power level, and the LF1 power and the LF2 power are turned OFF. That is, in the time from a timing $t_0$ to a timing $t_{11}$, plasma containing radicals and ions is generated by the supply of the HF power. As a result, as illustrated in (a) of FIG. 6, an etching target film 100 is etched through a mask 101, and the radicals R mainly adhere to the inner wall of the hole HL formed in the etching target film 100.

When the HF power shifts to the OFF state at a timing $t_{11}$ after the period (1) elapses, the radicals, the ions, and the plasma temperature are attenuated with their respective time constants, as in the example illustrated in FIG. 4. According to the attenuation state of the plasma parameters, the timing for turning ON each of the LF1 power and the LF2 power may be controlled in the period (3) when the HF power is turned OFF, the period (2) when the power level is lowered, and the period when the by-products are exhausted. At this time, the period (4) when the LF1 power is turned ON does not overlap, in time, with the period (1) when the HF power is set to the High power level. Further, a period (6) when the LF2 power is turned ON does not overlap with the periods (1) and (4) in time.

In the present embodiment, at the timing $t_{11}$, the HF power shifts from the High power level to the OFF state, and the LF1 power shifts to the ON state. Accordingly, the LF1 power is maintained in the ON state in the period (4) that coincides with the period (3) in time, and as illustrated in (b) of FIG. 6, the flux of ions that reach the bottom of the etched recess may be controlled. Further, the amount of by-products during the etching may be suppressed. The LF2 power is maintained in the OFF state at the timing $t_{11}$, and maintained in the OFF state in a period (7) that coincides with the period (3) in time.

Further, the period (4) is set to time of 30 μs or less. Further, the period (4) does not overlap with the period (1) in time. When the LF1 power is supplied for the short time of 30 μs or less in the period (4), the incidence angle of ions is controlled to be more vertical, so that an etching with a high anisotropy may be implemented.

At a timing $t_{12}$ after the periods (3) and (4) elapse, the HF power shifts to the Low power level, the LF1 power shifts to the OFF state, and the LF2 power shifts to the ON state. In the period (2) until a timing $t_{13}$, the HF power is maintained at the Low power level. In the periods (3) and (2), the HF power may be at the Low power level or may be in the OFF state. The LF1 power is maintained in the OFF state in the period (5) that coincides with the period (2) in time, and the LF2 power is maintained in the ON state in the period (6) that coincides with the period (2) in time. As described above, the period (6) does not overlap with the periods (1) and (4) in time.

In the present embodiment, the LF2 power having a frequency lower than the frequency of the LF1 power supplied in the period (4) is supplied in the period (6). The Vpp of the LF2 power is larger than the Vpp of the LF1 power. Accordingly, in the period (6), the Vpp of the bias voltage may be made larger than that in the period (4), the ion energy $\varepsilon_I$ may be made further larger, and the incidence angle of ions may be controlled to be more vertical. Thus, it is possible to control the flux of ions that reach the bottom of the etched recess in the period (6) when the LF2 power is being supplied. As a result, as illustrated in (c) of FIG. 6, a by-product B or the like that remains at, for example, the corners of the bottom of the hole HL may be etched, so that the etching may be promoted.

In this way, in the process of etching a deep hole having a high aspect ratio, the mask selectivity may be improved, and the incidence angle of ions may be made vertical, by using the pulsed signals of the HF power, the LF1 power, and the LF2 power. Thus, the etching shape may be made vertical, or the etching may be promoted. However, the process of etching a deep hole having a high aspect ratio is an example of the substrate processing, and the type of the process is not limited thereto.

In the exhaust period, the exhaust of by-products is controlled. That is, in the exhaust period, the HF power, the LF1 power, and the LF2 power are controlled to be brought into the OFF state. Accordingly, as illustrated in (d) of FIG. 6, the by-product B in the hole HL is exhausted. Then, the etching of the next cycle may be promoted. The exhaust period is preset to time when the by-product B does not adhere to the substrate W again.

In the example of FIG. 6, the power level of the HF power is controlled to the three levels, and the power levels of the LF1 power and the LF2 power are controlled to the two levels of the ON/OFF states. However, the present disclosure is not limited thereto. For example, the power level of the HF power may be controlled to four levels or more.

At a timing $t_{14}$, one cycle ends, and shifts to the period (1) of the next cycle. Then, at a timing $t_0$ of the next cycle, the HF power shifts to the High power level, and the LF1 power and the LF2 power are maintained in the OFF state. For the first RF pulsed signal, the HF power is set to the predetermined state in the order of the period (1)→the period (3)→the period (2)→the exhaust period. For the second RF pulsed signal, the LF1 power is set to the predetermined state in the order of the period (4)→the period (5)→the exhaust period. For the third RF pulsed signal, the LF2 power is set to the predetermined state in the order of the period (7)→the period (6)→the exhaust period. Each pulse cycle is repeated, one cycle is 1 kHz to 20 kHz, and the period (4) is 30 μs or less. The plurality of first to third pulse cycles have the same time period, and each pulse cycle has a time period of 50 µs to 1,000 µs. That is, one cycle of the pulse cycle is 50 µs to 1,000 µs.

The power level of the HF power in the period (1) is an example of the first power level, the power level of the HF power in the period (2) is an example of the second power level, and the power level of the HF power in the period (3) is an example of the third power level. The power level of the LF1 power in the period (4) is an example of the fourth power level, and the power level of the LF1 power in the period (5) is an example of the fifth power level. The power level of the LF2 power in the period (6) is an example of the sixth power level, and the power level of the LF2 power in the period (7) is an example of the seventh power level.

FIG. 7 illustrates another example of the control of the radio-frequency power pulses of the three frequencies. In this example as well, the control of the pulsed signal of each of the HF power, the LF1 power, and the LF2 power is repeated per cycle that includes the first pulse cycle of the HF power, the second pulse cycle of the LF1 power, or the third pulse cycle of the LF2 power. All of the pulse cycles may include the exhaust period.

The pulse cycle patterns of FIG. 6 and the pulse cycle patterns of FIG. 7 are different from each other in that while FIG. 7 includes the delay time $T_{delay}$ after the timing $t_{11}$ at which the period (1) ends, FIG. 6 does not include the delay time $T_{delay}$ after the timing $t_{11}$. This difference will be described hereafter, and descriptions of other pulse cycle patterns as illustrated in FIG. 8 will be omitted since the pulse cycle patterns are the same as illustrated in FIG. 6.

For example, as illustrated in FIG. 4, in a case where the LF1 power or the LF2 power is turned ON when the plasma temperature (Te) is high, a large amount of by-products are generated, which may hinder the etching. Accordingly, it may be conceivable to turn ON the LF1 power or the LF2 power while avoiding the time when the plasma temperature is high. That is, the plasma temperature decreases at the timing $t_{21}$ after the predetermined delay time $T_{delay}$ elapses from the timing $t_{11}$. At this timing, the LF1 power shifts to the ON state. That is, the LF1 power shifts to the ON state after time is shifted (delayed) by the delay time $T_{delay}$ from the timing $t_{11}$ when the HF power shifts to the OFF state. As a result, the amount of by-products during the etching may be suppressed, and the etching may be promoted.

In the present embodiment, the HF power is turned OFF in the delay time $T_{delay}$. However, the power level of the HF power in the delay time $T_{delay}$ may be set to the Low level which is lower than the power level of the HF power in the period (1). By lowering the power level of the HF power, it is possible to reduce the generation of radicals and ions in the delay time $T_{delay}$ before the timing $t_{21}$ when the LF1 power is supplied. As a result, it is possible to control the flux of ions that reach the bottom of the recess formed in the etching target film in the period (4) from the timing $t_{21}$ to the timing $t_{12}$ after the delay time $T_{delay}$ elapses. The period (4) is set to a time of 30 µs or less. Further, the period (4) does not overlap with the period (1) in time. The next period (5) and the exhaust period are set to arbitrary times, and may be longer than 30 µs. In this way, when the LF1 power is supplied for the short time of 30 µs or less in the period (4), the incidence angle of ions is controlled to be more vertical, so that an etching with a high anisotropy may be implemented.

Further, at the timing $t_{12}$, the LF1 power shifts to the OFF state, and the LF2 power shifts to the ON state. The LF1 power shifts to the OFF state in the period (5), and the LF2 power shifts to the ON state in the period (6) that overlaps with the period (5) in time. Accordingly, in the period (6), the incidence angle of ions may be controlled to be more vertical than that in the period (4). However, when the delay time $T_{delay}$ is excessively long, the ions are lost, and thus, the delay time $T_{delay}$ is preset to an appropriate value.

Through this control, the ON/OFF states of the LF1 power and the ON/OFF states of the LF2 power are caused to shift to the ON state in different times, so that the behavior of the ions is mainly controlled. The HF power has the zero (0) power level in the period (3), the LF1 power has a power level larger than zero (0) in the period (4), and the LF2 power has the zero (0) power level in the period (7) that overlaps with the period (4). The LF2 power has a power level larger than zero (0) in the period (6), the LF1 power has the zero (0) power level in the period (5) that overlaps with the period (6), and the HF power has a power level larger than zero (0) in the period (2). That is, the times when the LF1 power and the LF2 power have the power levels larger than zero (0) do not overlap with each other.

The LF2 power implements the mask selectivity higher than that of the LF1 power, and enables the vertical etching. In the period (1) when the power level of the HF power is higher than that in the period (2), the radicals and the ions are generated in large amounts, and the effects described above may be hardly achieved even though the LF2 power is supplied in the period (1). Meanwhile, in the period (2) when the power level of the HF power is lower than that in the period (1), and the period (3) of the zero (0) power level, the generation of radicals and ions decreases. Accordingly, by supplying the LF1 power in the period (4) that overlaps with the period (3) and supplying the LF2 power in the period (6) that overlaps with the period (2), the effects described above may easily be achieved. Accordingly, by supplying the LF1 power and the LF2 power in the periods, the ion energy may be increased, so that the incidence angle of ions may be made vertical. As a result, in the periods (2) and (3), the mask selectivity is higher than that in the period (1), and the vertical etching may be implemented.

Further, the LF1 power and the LF2 power may generate the pulsed signals that have the two power levels of the ON state and the OFF state. However, the LF1 power and the LF2 power may generate pulsed signals that have two or more power levels, such as the ON state, the OFF state, and the Middle power level. The LF1 power and the LF2 power may have two different ON states.

FIG. 8 illustrates another example of the pulse patterns of the radio-frequency power pulses of the three frequencies. The control of the pulsed signal of each of the HF power, the LF1 power, and the LF2 power is repeated per cycle that includes the first pulse cycle of the HF power, the second pulse cycle of the LF1 power, or the third pulse cycle of the LF2 power. All of the pulse cycles may include the exhaust period.

The pulse cycle patterns of FIG. 8 and the pulse cycle patterns of FIG. 7 are different from each other, in that the order of turning ON the LF1 power and the LF2 power in FIG. 8 is reverse to that in FIG. 7, and the timing of the delay time $T_{delay}$ in FIG. 8 is shifted accordingly. The delay time $T_{delay}$ is provided immediately before the LF1 power shifts to the ON state.

In the present example as well, the LF1 power or the LF2 power is turned ON while avoiding the time when the plasma temperature is high. In the present example, the LF2 power and the LF1 power are turned ON in this order. At a timing $t_{11}$ after the period (1) elapses, the plasma temperature decreases. At this timing, that is, at the timing $t_{11}$ when the HF power shifts to the Low power level lower than the High power level, the LF2 power shifts to the ON state, and in the period (6) that coincides with the period (2) in time, the LF2 power is maintained in the ON state. Accordingly, the amount of by-products during the etching may be suppressed, and the etching may be promoted.

The LF1 power is maintained in the OFF state in the period (5) that coincides with the period (2) in time from the timing $t_{11}$ to a timing $t_{12}$. In the present embodiment, at the timing $t_{12}$, the HF power shifts to the OFF state, the LF1 power is maintained in the OFF state, and the LF2 power shifts to the OFF state. The HF power is maintained in the OFF state in the delay time $T_{delay}$. However, the power level of the HF power in the delay time $T_{delay}$ may be the Low level lower than the power level of the HF power in the period (1). By further lowering the power level of the HF power, it is possible to reduce the generation of radicals and ions in the delay time $T_{delay}$ before a timing $t_{22}$ when the LF1 power is supplied. At the timing $t_{22}$ after the delay time $T_{delay}$ elapses from the timing $t_{12}$, the LF1 power shifts to the ON state. At the timing $t_{22}$, the HF power and the LF2 power are maintained in the OFF state. As a result, the flux of ions that reach the bottom of the recess formed in the etching target film may be controlled in the period (4) from the timing $t_{22}$ to the timing $t_{13}$ after the delay time $T_{delay}$ elapses. At this time, the period (4) is set to time of 30 µs or less. Further, the period (4) does not overlap with the period (1) in time. The period (5) that coincides with the period (2) in time, and the exhaust period are set to arbitrary times, and may be each longer than 30 µs. That is, in the present example, the LF1 power is maintained in the ON state for the time of 30 µs or less in the period (4). In this way, when the LF1 power is supplied for the short time of 30 µs or less in the period (4), the incidence angle of ions may be controlled to be more vertical, so that an etching with a high anisotropy may be implemented. However, when the delay time $T_{delay}$ is excessively long, the ions are lost, and thus, the delay time $T_{delay}$ is preset to an appropriate value.

Figure 9:
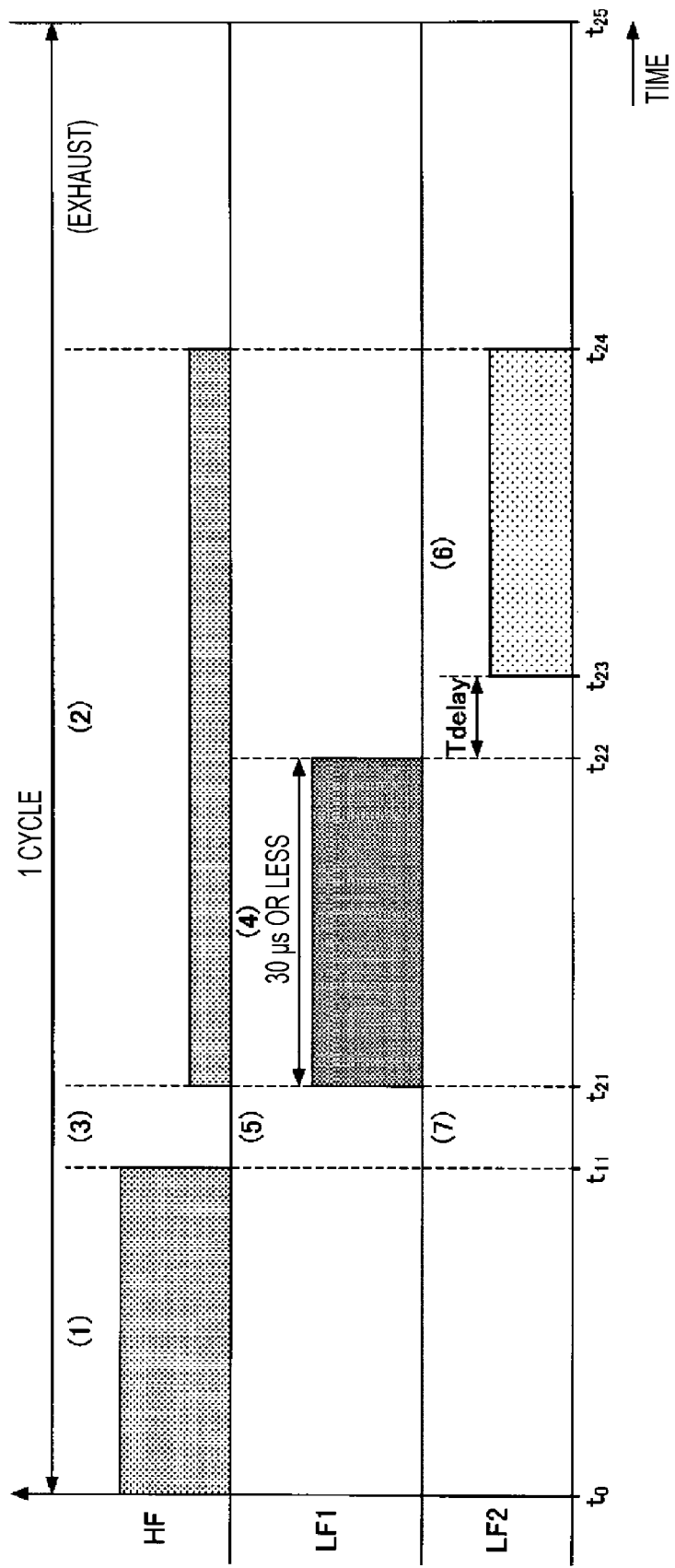
FIG. 9 is a view illustrating pulse patterns of radio-frequency power pulses of three frequencies according to an embodiment.

FIG. 9 illustrates another example of the control of the radio-frequency power pulses of the three frequencies. In this example as well, the control of the pulsed signal of each of the HF power, the LF1 power, and the LF2 power is repeated per cycle that includes the first pulse cycle of the HF power, the second pulse cycle of the LF1 power, and the third pulse cycle of the LF2 power. All of the pulse cycles may include the exhaust period.

The pulse cycle patterns of FIG. 9 and the pulse cycle patterns of FIGS. 7 and 8 are different from each other, in that while the delay time $T_{delay}$ in FIGS. 7 and 8 is provided immediately before the LF1 power shifts to the ON state, the delay time $T_{delay}$ in FIG. 9 is provided immediately before the LF2 power shifts to the ON state.

In the present example, in the period (1), the HF power is maintained at the High power level, and the LF1 power and the LF2 power are maintained in the OFF state. In the periods (5) and (7) that coincide with the periods (2) and (3) in time, all of the HF power, the LF1 power, and the LF2 power are maintained in the OFF state (the exhaust period).

Then, at a timing $t_{21}$, the HF power shifts to the Low power level lower than the High power level, and the LF1 power shifts to the ON state. At the timing $t_{21}$, the LF2 power is maintained in the OFF state. Then, in the period (2), the HF power is maintained at the Low power level. The LF1 power is maintained in the ON state in for time of 30 µs or less in the period (4) that overlaps with the period (2) in time (i.e., that coincides with a first portion of the period (2) in time). The LF1 power shifts to the OFF state at the timing $t_{22}$ in the period (2), and the LF2 power shifts to the ON state at a timing $t_{23}$ after the delay time $t_{delay}$ elapses from the timing $t_{22}$. At the timings $t_{22}$ and $t_{23}$, the HF power is maintained at the Low power level. Then, the LF2 power is maintained in the ON state in the period (6) that overlaps with the period (2) in time (i.e., that coincides with a second portion of the period (2) in time) from the timing $t_{23}$.

As described above, in the present example, the LF1 power and the LF2 power are alternately turned ON in the period (2) when the HF power is maintained at the Low power level. Further, in the period (4), the LF1 power is supplied for the short time of 30 µs or less. Accordingly, the incidence angle of ions may be controlled to be more vertical, so that an etching with a high anisotropy may be implemented. Since the control of the exhaust period from a timing $t_{24}$ to a timing $t_{25}$ after the period (6) elapses is the same as that of the other pulse cycles, descriptions thereof will be omitted.

As described above, according to the plasma processing apparatus and the plasma processing method of the present embodiment, the performance of a process may be improved by using a plurality of radio-frequency power pulsed signals.

According to an aspect, the performance of a process may be improved by using a plurality of radio-frequency power pulsed signals.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
  a chamber;
  a first matching circuit coupled to the chamber;
  a second matching circuit coupled to the chamber;
  a first RF generator coupled to the first matching circuit, and configured to generate a first RF pulsed signal including a plurality of first pulse cycles, each first pulse cycle including a first period, a second period, and a third period, and the first RF pulsed signal having a first power level in the first period, a second power level in the second period, and a third power level in the third period;
  a second RF generator coupled to the second matching circuit, and configured to generate a second RF pulsed signal including a plurality of second pulse cycles, each second pulse cycle including a fourth period and a fifth period, the second RF pulsed signal having a frequency lower than a frequency of the first RF pulsed signal and having a fourth power level in the fourth period and a fifth power level in the fifth period, and the fourth period being 30 µs or less and set not to overlap with the first period; and
  a third RF generator coupled to the second matching circuit, and configured to generate a third RF pulsed signal including a plurality of third pulse cycles, each third pulse cycle including a sixth period and a seventh period, the third RF pulsed signal having a frequency lower than the frequency of the second RF pulsed signal and having a sixth power level in the sixth period and a seventh power level in the seventh period, and the sixth period being set not to overlap with the first period and the fourth period.

2. The plasma processing apparatus according to claim 1, wherein the third power level, the fifth power level, and the seventh power level are zero power levels.

3. The plasma processing apparatus according to claim 2, wherein the first power level is larger than the second power level,
the second power level is larger than the third power level, the fourth period overlaps with the third period, and
the sixth period overlaps with the second period.

4. The plasma processing apparatus according to claim 3, wherein each of the plurality of first pulse cycles shifts from the first period to the third period, and shifts from the third period to the second period,
the fourth period coincides with the third period, and
the sixth period coincides with the second period.

5. The plasma processing apparatus according to claim 3, wherein each of the plurality of first pulse cycles shifts from the first period to the third period, and shifts from the third period to the second period,
the fourth period starts after a delay time elapses since the shift from the first period to the third period, and ends simultaneously with the shift from the third period to the second period, and
the sixth period coincides with the second period.

6. The plasma processing apparatus according to claim 3, wherein each of the plurality of first pulse cycles shifts from the first period to the second period, and shifts from the second period to the third period,
the fourth period starts after a delay time elapses since the shift from the second period to the third period, and ends simultaneously with an end of the third period, and
the fifth period coincides with the second period.

7. The plasma processing apparatus according to claim 2, wherein the first power level is larger than the second power level,
the second power level is larger than the third power level, the fourth period overlaps with the second period, and
the sixth period overlaps with the third period.

8. The plasma processing apparatus according to claim 7, wherein each of the plurality of first pulse cycles shifts from the first period to the third period, and shifts from the third period to the second period,
the fourth period starts simultaneously with the shift from the third period to the second period, and ends before an end of the second period, and
the sixth period starts simultaneously with an end of the fourth period or after a delay time elapses after the end of the fourth period, and ends before the end of the second period.

9. The plasma processing apparatus according to claim 8, wherein each of the plurality of first pulse cycles is 50 µs to 1,000 µs.

10. The plasma processing apparatus according to claim 9, wherein the first RF pulsed signal is a frequency of 20 MHz to 60 MHz,
the second RF pulsed signal is a frequency of 1 MHz to 15 MHz, and
the third RF pulsed signal is a frequency of 100 kHz to 4 MHz.

11. The plasma processing apparatus according to claim 10, wherein the third RF pulsed signal has a zero power level in a period when the second RF pulsed signal has a power level larger than zero.

12. The plasma processing apparatus according to claim 1, wherein the first power level is larger than the second power level,
the second power level is larger than the third power level, the fourth period overlaps with the third period, and
the sixth period overlaps with the second period.

13. The plasma processing apparatus according to claim 1, wherein the first power level is larger than the second power level,
the second power level is larger than the third power level, the fourth period overlaps with the second period, and
the sixth period overlaps with the third period.

14. The plasma processing apparatus according to claim 1, wherein each of the plurality of first pulse cycles is 50 µs to 1,000 µs.

15. The plasma processing apparatus according to claim 1, wherein the first RF pulsed signal is a frequency of 20 MHz to 60 MHz,
the second RF pulsed signal is a frequency of 1 MHz to 15 MHz, and
the third RF pulsed signal is a frequency of 100 kHz to 4 MHz.

16. The plasma processing apparatus according to claim 1, wherein the third RF pulsed signal has a zero power level in a period when the second RF pulsed signal has a power level larger than zero.

17. A plasma processing apparatus comprising:
a chamber;
at least one first matching circuit coupled to the chamber;
a first RF generator coupled to the at least one first matching circuit, and configured to generate a first RF pulsed signal including a plurality of first pulse cycles, each first pulse cycle including a first period and a second period, and the first RF pulsed signal having a first power level in the first period and a second power level in the second period; and
a second RF generator coupled to the at least one first matching circuit, and configured to generate a second RF pulsed signal including a plurality of second pulse cycles, each the second pulse cycle including a third period and a fourth period, the second RF pulsed signal having a frequency lower than a frequency of the first RF pulsed signal, and having a third power level in the third period and a fourth power level in the fourth period, and the third period being 30 µs or less and set not to overlap with the first period,
wherein the second power level and the fourth power level are zero power levels.

* * * * *